United States Patent [19]

Baumgarten

[11] 4,162,403
[45] Jul. 24, 1979

[54] METHOD AND MEANS FOR COMPENSATING FOR CHARGE CARRIER BEAM ASTIGMATISM

[75] Inventor: Neil H. Baumgarten, Needham, Mass.

[73] Assignee: Advanced Metals Research Corp., Bedford, Mass.

[21] Appl. No.: 928,086

[22] Filed: Jul. 26, 1978

[51] Int. Cl.² ................... G21K 1/08; G01M 23/00
[52] U.S. Cl. ........................... 250/396 ML; 250/311
[58] Field of Search ............... 250/311, 396 ML, 396

[56] References Cited
U.S. PATENT DOCUMENTS 3,597,609  8/1971  Anger .................................. 250/311

Primary Examiner—Harold A. Dixon
Attorney, Agent, or Firm—Cesari & McKenna

[57] ABSTRACT

In a scanning electron microscope of the type including a manually controllable stigmator coil system for compensating for beam astigmatism, means are included for providing, simultaneously and in a single image, a mapped display of all possible stigmator correction values as a function of coordinate location in the display. The operator of the microscope, by viewing the mapped display, may readily locate the best-corrected area therein and thereby select the correction values that best achieve astigmatism correction. Means are also included which enable the operator to locate the best-corrected area on the mapped display by movable index markers which automatically couple the proper correction values to the stigmator system. The mapped display also serves as an aid in obtaining optimum beam focus and as an indicator of the condition of the microscope.

12 Claims, 15 Drawing Figures

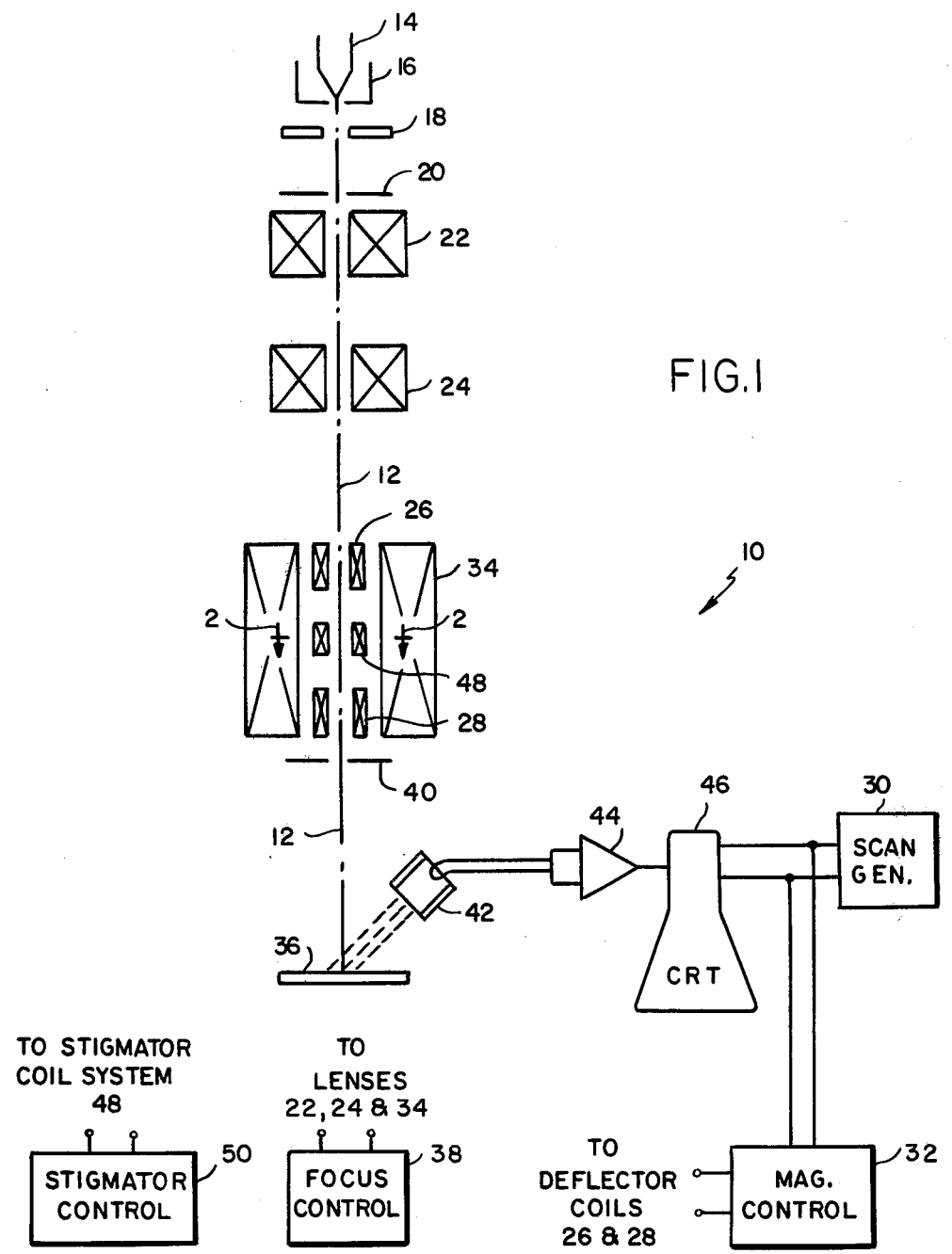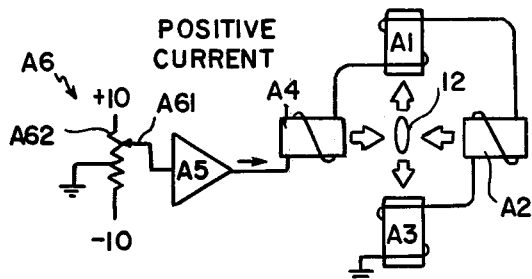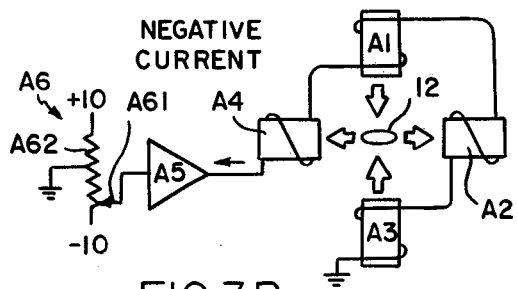

METHOD AND MEANS FOR COMPENSATING FOR CHARGE CARRIER BEAM ASTIGMATISM

BACKGROUND OF THE INVENTION

This invention relates generally to charge carrier beam systems and, more particularly, to a method and means for compensating for charge carrier beam astigmatism.

A scanning electron microscope is an electron-optical instrument used to produce images of extremely small objects on a suitable display, such as a cathode-ray tube display, from which the images may be viewed or photographed. The microscope image is generated by scanning the object to be viewed with a finely focused beam of electrons deflected in a raster pattern, similar to the way a television picture is generated. Deflection of the electron beam across the object surface is accomplished by transverse magnetic fields generated by applying current ramps to electromagnetic X and Y deflection coils disposed about the beam in an electron-optical column. Image magnification is controlled by varying the magnitude of the currents applied to the deflection coils and thereby changing the size of the raster projected onto the object surface. Secondary electrons emitted from the object are collected, amplified and used to modulate the brightness of the cathode ray tube display, which is scanned in exact spatial synchronization with the object scanning electron beam.

In order to obtain the high magnification and resolution that are characteristic of the scanning electron microscope (i.e., detail on the order of 50 Angstrom units), it is necessary to reduce the cross-sectional diameter of the object scanning electron beam to a very small spot size which is at least smaller than the object to be observed. Beam reduction is accomplished by electromagnetic lenses located in the electron-optical column which generate circularly symmetric magnetic fields around the electron beam. The electromagnetic lenses funnel the beam into a well-defined, ideally perfectly circular focal point or spot at the object surface.

Among the unavoidable distortions and aberrations that contribute to the degradation of the ideally circular beam spot in scanning electron microscopes is astigmatism, or elliptical assymetry of the beam cross-section. Astigmatism results in a "smearing" of the microscope image detail in a direction corresponding to the longer axis of the elliptical beam, making the image detail difficult to view and analyze. Astigmatism can arise from several faults in the microscope, most commonly from dust or other particle contamination or misalignment of critical interior surfaces in the electron-optical column, and is present to some degree in every instrument. Although astigmatism can never be entirely avoided, it can be effectively cancelled by applying precisely adjusted magnetic correcting fields to the beam which serve to mold the beam back into a minimum diameter symmetrical shape. In the typical instrument, the astigmatism cancellation is accomplished by electromagnetic stigmator coils located in the column and arranged in an octopole configuration around the electron beam axis.

More specifically, in the typical stigmator system, eight stigmator coils are angularly disposed about the beam axis and are driven as two interleaved sets of four coils wired in series. Each coil set consists of two opposing coil pairs angularly spaced from one another by 90 degrees. The sense of the windings in each opposing pair is such that the direction of the magnetic field produced by one coil in a pair always opposes that of the other coil in the pair directly across the beam axis. In addition, the two pairs in a set always create fields in the reverse sense of each other so that while one pair "squeezes" or "pushes" the beam toward the beam axis, the other pair "stretches" or "pulls" the beam away from the beam axis.

Each coil set is fed from an adjustable current source which permits a driving current of adjustable magnitude and direction to be supplied through each coil in the set. Increasing the magnitude of the driving current through the coils has the effect of increasing the degree of beam "push" and "pull", while reversing the direction of the current has the effect of exchanging the "push" with the "pull" and vice versa for each coil in the set. Having independently adjustable current drives for each coil set enables control of the resultant correcting fields with near-perfect two dimensional orthogonality. A suitable correction may thus be found for beam astigmatism oriented at any angle to the stigmator coil system.

Since, in the operation of a scanning electron microscope, the cross-sectional shape of the electron beam cannot be viewed directly, astigmatism can only be evaluated indirectly, by judging its effect on the image of the object being viewed. Conventionally, astigmatism correction is accomplished by carefully viewing the image while the settings on a pair of stigmator control knobs on the microscope control panel are independently adjusted to vary the driving currents applied to the two coil sets in the stigmator system. The astigmatism correction process is, as a result, conducted on a trial and error basis similar to the way focusing is achieved, except that the process is further complicated by the need to vary two independent stigmator settings. While an expert operator can usually find the optimum combination of settings without too much difficulty, visualization of the rather subtle effects of the stigmator controls is a difficult proposition for the great majority of average operators. Consequently, it often takes considerable time and effort to achieve suitably corrected, high resolution images. Astigmatism correction has become an even more significant problem in recent years as the number of scanning electron microscopes placed has steadily increased and as the uses to which they are put have become more and more routine.

Although some complex computer-aided techniques for astigmatism evaluation have been described, the apparatus necessary to implement the techniques is extremely expensive and is used typically only in the most sophisticated applications. No practical, economical improvement in the conventional stigmator hardware or manual adjustment method has heretofore been proposed.

OBJECTS OF THE INVENTION

It is, therefore, a broad object of this invention to provide improvements in charge carrier beam systems.

Another object of the invention is to provide an improved method and means for compensating for astigmatism in charge carrier beam instruments.

Another, more specific object of the invention is to provide an improved electron beam astigmatism compensating method and means for a scanning electron microscope which greatly simplifies astigmatism adjustment and greatly facilitates the ability of even average microscope operators to achieve optimum adjustment.

Still another object of the invention is to provide astigmatism compensating means of the type described that is simple and economical to implement even in conventional instruments.

Still yet another object of the invention is to provide an improved beam astigmatism compensating method and means that also serves as an aid in achieving optimum beam focus on an object and as an indicator of instrument condition.

SUMMARY OF THE INVENTION

In accordance with an illustrative embodiment of the invention, means are provided in a scanning electron microscope for simultaneously presenting to an operator a display of the effects of all possible settings of astigmatism correction controls as a linear function of X and Y location within the scanning raster. This display is illustratively obtained by temporarily disconnecting the manual stigmator control inputs from the two coil sets in an octopole stigmator coil system and by driving one coil set in the system with a X scanning ramp signal and the other coil set in the system with a Y scanning ramp signal. The peak values of the X and Y scanning ramp signals are adjusted to match the maximum positive and negative voltages normally applied through the manual stigmator controls in achieving the maximum positive and negative stigmator coil drive currents. The resultant microscope image is a "map" of all possible stigmator coil settings upon which each point with coordinates $(V_1,V_2)$ shows the effect of applying static control voltages $V_1$ and $V_2$, respectively, to the two stigmator coil sets.

When viewing the display, the operator may simultaneously observe and directly compare various areas of the image to determine the best-corrected (i.e., sharpest) area. The "center of sharpness" is usually quite well defined at high magnifications and appears as the center of a vortex of astigmatism in the image. The operator need only select the X and Y coordinates located at the center of sharpness to identify the two stigmator coil drive values required to correct the astigmatism. To facilitate this selection, X and Y index line markers are illustratively generated in the display so that they appear at the X and Y coordinates corresponding exactly to the settings of the two manual stigmator controls. The operator individually positions the X and Y line markers by adjusting the two stigmator controls until the markers intersect over the center of sharpness in the mapped display. If the mapping X and Y signals and line markers are then switched off, the X and Y coordinate values that achieve astigmatism correction are automatically applied to the stigmator coils.

With the above method and means, astigmatism correction is no longer a blind trial-and-error process masterable only by a few highly skilled operators, but rather becomes a straightforward alignment routine similar to aiming a gunsight at a target. It thus becomes considerably easier for operators of all relative skills to achieve clear, sharp, high resolution images. Also, since the X and Y scanning ramp signals used to generate the mapped display and voltages used in the generation of the X and Y index line markers are already present in a typical scanning electron microscope, the additional circuitry necessary to implement the method is minimal. If desired, the entire astigmatism correction method could be fully automated by a fairly modest computer, thus removing from the correction method any dependence on the operator's judgment.

While the primary purpose of the above described method and means is astigmatism correction, other uses are possible. For example, the mapped display can also be used to determine the quality of the focus of the electron beam in the scanning elctron microscope. Images which are slightly out-of-focus exhibit a characteristic curved or comet-like distortion when viewed in the mapped display, with the direction of the curve or comet travel being different depending upon whether the beam is over-focused or under-focused. The distortion disappears only when the final focus setting on the microscope is correct. The mapped display may thus be used as an aid in achieving optimum focus.

Additionally, the radial distance from the center of the mapped display to the center of sharpness therein is a direct measure of the magnitude of the resultant astigmatism correction and, therefore, a gauge of the severity of the beam astigmatism in the instrument. The mapped display may thus also be useful as an indicator of when routine periodic maintenance of the instrument is due.

BRIEF DESCRIPTION OF THE DRAWING

The foregoing and other objects, features and advantages of the invention will be better understood from the following detailed description taken in conjunction with the accompanying drawing in which:

FIG. 1 is a partially block diagrammatic, partially schematic illustration of the basic components of a conventional scanning electron microscope;

FIG. 3, which comprises FIGS. 3A and 3B, illustrates schematically a conventional driving arrangement for a stigmator coil set shown in the system of FIG. 2;

FIG. 5, which comprises

FIG. 7, which comprises FIG. 8, which comprises

DETAILED DESCRIPTION OF ILLUSTRATIVE EMBODIMENT

Figure 2:
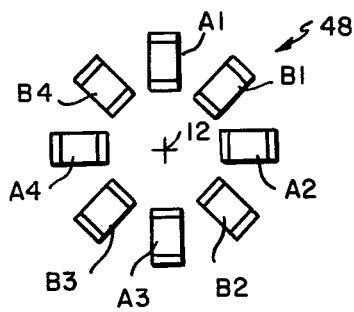
FIG. 2 illustrates the arrangement of electromagnetic coils in an octopole stigmator system utilized in the scanning electron microscope of FIG. 1.

Referring now specifically to the drawing, and initially to FIG. 1 thereof, there are shown the basic components of a scanning electron microscope 10. A beam of electrons, represented by center line 12, is generated in a known manner by a controllable source comprising cathode 14, Wehnelt cylinder 16 and anode 18. The beam 12 passes through a spray aperture 20 to first and second electromagnetic condenser lenses 22 and 24 arranged in a column about the beam 12 which serve to collimate the beam 12. At a lower position in the column, the beam 12 passes through first and second electromagnetic deflection coils 26 and 28 which serve to deflect the beam 12 in a raster pattern similar to the way a television picture is generated. The deflection coils 26 and 28 are driven by X and Y scanning ramp signals generated in a scan generator 30 and applied through a magnification control unit 32 as X and Y drive currents to the coils 26 and 28. The size of the beam raster pattern, and therefore the magnification produced by the microscope 10, is controlled using the magnification control unit 32 which varies the magnitude of the X and Y drive currents applied to the coils 26 and 28.

A final electromagnetic lens 34 is disposed about the deflection coils 26 and 28 and produces fine focussing of the beam 12 to an extremely small, well-defined, ideally perfectly circular beam spot on an object 36 to be viewed at high magnification. Each of the lenses 22, 24 and 34 is designed to generate circularly symmetric magnetic focussing fields about the beam 12 in response to drive currents supplied from a focus control unit 38. The focus control unit 38 is typically equipped with independent controls for each of the lenses 22, 24 and 34.

The beam 12 passes through a final, beam limiting aperture 40 before impinging upon the object 36.

The incident beam 12 causes secondary electrons to be emitted from the object 36, with the current density of the secondary electrons varying according to the depth and surface characteristics of the object 36 at the point of beam impact. The emitted secondary electrons are collected by a secondary electron collector 42, amplified by a photomultiplier tube amplifier 44 and the resulting current is coupled to, and used to modulate the brightness of, a suitable display such cathode ray tube (CRT) 46. As is known, the CRT 46 also utilizes a scanning electron beam which is caused to scan across the tube display under the control of the X and Y scanning ramp signals from the scan generator 30. Since the same scanning signals are used to drive both the beam in the CRT 46 and the beam 12 in the microscope 10, the two beams are scanned in exact spatial synchronization and the image produced by the CRT 46 is a representation of the object 36 at high magnification.

As previously noted, contamination, component misalignment or the like typically cause the electron beam 12 in the microscope 10 to have an elliptical rather than perfectly circular beam spot or cross-section at the object 36. The beam elliptically causes astigmatism in the image produced by the CRT 46. For this reason, an electromagnetic stigmator coil system 48 is incorporated in the microscope 10, typically between the two deflection coils 26 and 28. Driving currents for the stigmator coil system 48 are generated in a stigmator control unit 50. The coil system 48 and stigmator driving currents from the unit 50 are such that magnetic correcting fields can be controllably generated to mold the elliptical beam 12 back into a minimum diameter, nearly perfectly circular shape.

The stigmator coil system 48 of FIG. 1 is shown in more detail in FIG. 2 of the drawing. The system 48 has an octopole configuration including eight electromagnetic coils A1 through A4 and B1 through B4 equally angularly disposed about the axis of the beam 12. The coils are arranged in two interleaved sets of four, with one set A including the coils A1, A2, A3 and A4 and the other set B including the coils B1, B2, B3 and B4. Each set comprises two opposing coil pairs separated by 90°.

FIGS. 3A and 3B illustrate one of the two coil sets shown in FIG. 2, e.g., the set A, together with current drive and control components therefor, which form part of the stigmator control unit 50 of FIG. 1. As indicated in FIGS. 3A and 3B, the coils A1 through A4 in the set A are wired in series. Drive current for the coils A1 through A4 is generated by a voltage controlled amplifier A5. The magnitude and direction of the drive current produced by the amplifier A5 is determined by a manual stigmator control A6 which comprises a movable wiper arm A61 and center grounded resistor A62. The opposed ends of the resistor A62 are maintained at corresponding positive and negative voltages (e.g., at +10 and −10 volts, respectively). Thus, by moving the wiper arm A61, the controlling input to the amplifier A5 may be varied from +10 to −10 volts to produce a proportional variation in the drive current output of the amplifier A5. FIG. 3A illustrates the situation where positive drive current is being supplied to the coils A1 through A4, while FIG. 3B illustrates negative drive current being supplied to the coils A1 through A4. The magnetic fields produced by the coils A1 through A4 are represented by the block arrows in FIGS. 3A and 3B.

As indicated, the sense of the windings in each coil in each coil pair is such that the direction of the magnetic field produced by one coil (e.g., A1) in a pair (e.g., A1–A3) opposes that of the other coil (e.g., A3) in the pair. Also, the two pairs in the set A create magnetic fields in the reverse sense of each other so that while one pair (e.g., A1–A3 in FIG. 3A) "stretches" or "pulls" the beam 12, the other pair (e.g., A2–A4 in FIG. 3A) "squeezes" or "pushes" the beam 12. As is evident by comparing FIG. 3A with FIG. 3B, a reversal in the direction of the drive current through the coils A1 through A4 results in a reversal in the direction of the magnetic fields produced thereby and in a reversal of the effect on the beam 12.

An identical, but independent current drive and control arrangement is provided for the coil set B that is interleaved with the coil set A in the stigmator coil system 48. The operator of the microscope 10 is thus provided with two independent stigmator controls A6 and B6 (FIG. 4) which must be manipulated to vary the correcting fields produced by the stigmator coil system 48. While viewing the image of the object 36 produced by the CRT 46, the operator seeks the optimum settings on the controls A6 and B6 that mold the beam 12 back into a minimum diameter, symmetrical shape and that thereby cancel the astigmatism in the image.

The above described components of the microscope 10 are conventional. For those desiring a more detailed description of such an instrument and its operation, reference may be made to the book entitled *Scanning*

*Electron Microscopy* by O. C. Wells, McGraw Hill (1974).

Figure 4:
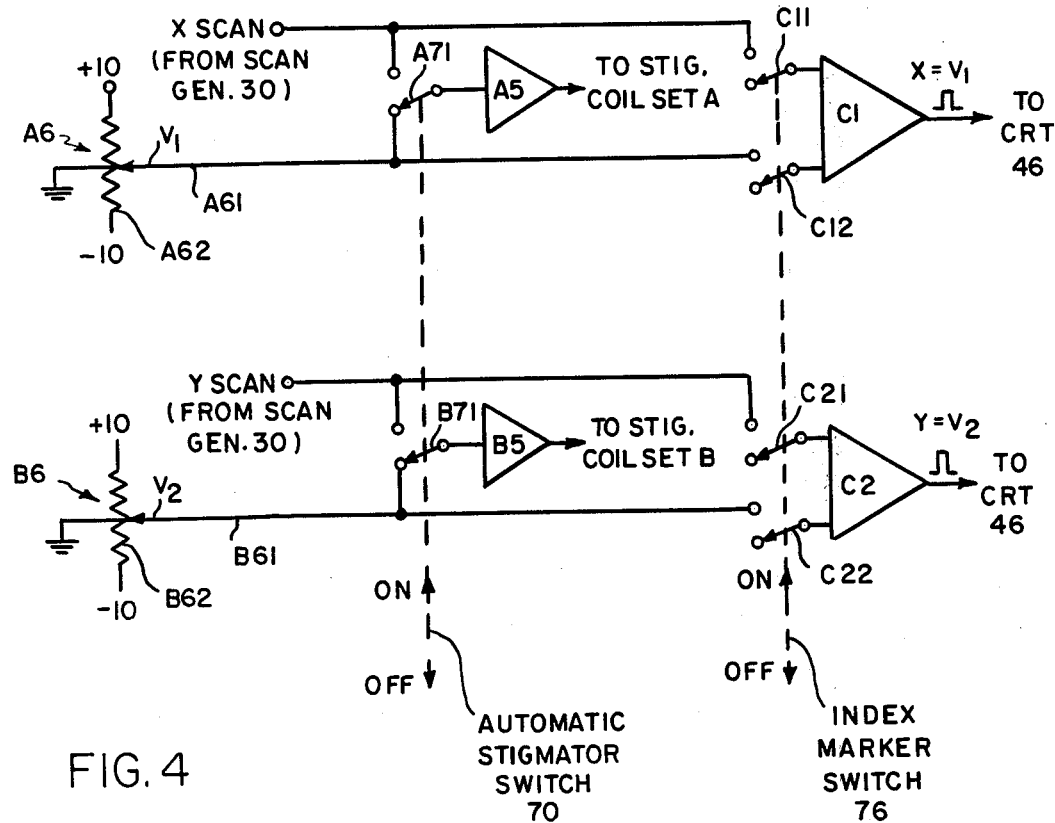
FIG. 4 illustrates schematically circuitry embodied in accordance with the invention for implementing the astigmatism compensating method of the invention in the scanning electron microscope shown in FIG. 1.

FIG. 4 illustrates circuitry embodied in accordance with the invention for implementing the improved astigmatism correcting or compensating method of the invention in the microscope 10. The manual stigmator controls referred to above are shown in FIG. 4 as A6 and B6, with each control comprising a movable wiper arm A61 and B61, respectively, and center grounded resistor A62 and B62, respectively. Voltage controlled amplifiers A5 and B5 generate the drive currents for the coil sets A and B in the stigmator system 48 of FIG. 2. As previously noted, that much of the circuitry shown in FIG. 4 is already present in the conventional microscope 10.

Figure 5A:
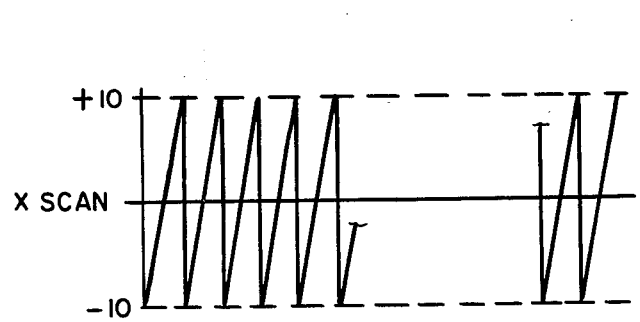
FIGS. 5A and 5B, illustrates the waveforms of XSCAN and YSCAN signals utilized in the circuitry of FIG. 4.
Figure 5B:
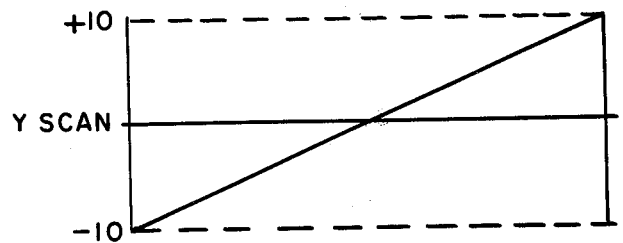

In accordance with the illustrative embodiment of the present invention, an automatic stigmator switch 70 is installed in the microscope control circuitry, which switch comprises movable switch contacts A71 and B71. When the switch 70 is in the OFF position, the amplifiers A5 and B5 are connected in the normal manner to the wiper arms A61 and B61 of the manual stigmator controls A6 and B6, respectively. When the switch 70 is in the ON position, however, the amplifiers A5 and B5 are disconnected from the manual controls A6 and B6 and connected to receive scanning ramp signals XSCAN and YSCAN, respectively. The XSCAN and YSCAN signals, which are shown in FIGS. 5A and 5B, respectively, are voltage signals taken from the scan generator 30 (FIG. 1) in the microscope 10 and have the same form and timing as the scanning ramp signals used to drive the deflection coils 26 and 28 in the microscope 10 and the electron beam in the CRT 46. The peak values of the XSCAN and YSCAN signals are selected to correspond to the maximum positive and negative control voltages provided from the manual stigmator controls A6 and B6 (e.g., +10 and −10 volts, respectively).

With the automatic stigmator switch 70 in the ON position, the stigmator coil system 48 in the microscope 10 is driven such that the effective correction on the beam 12 produced thereby varies as a linear function of X and Y location within the scanning raster. The image produced by the CRT 46 thus becomes a "map" of all possible settings of the manual stigmator controls A6 and B6 within which each point with coordinates $(V_1,V_2)$ shows the effect of applying static control voltages $V_1$ and $V_2$ to the amplifiers A5 and B5, respectively.

Figure 6:
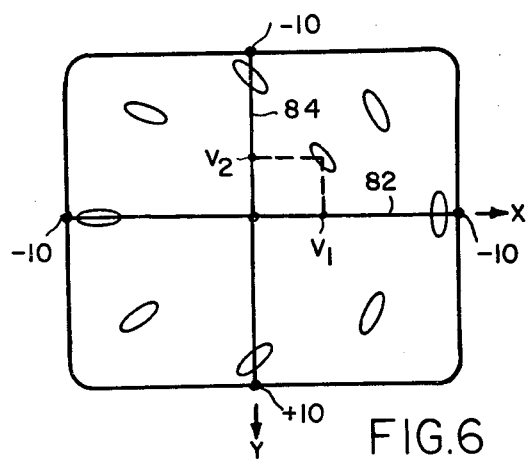
FIG. 6 depicts the orientation and magnitude of astigmatism correction at various coordinate locations in a mapped display of the type produced by the circuitry of FIG. 4.

FIG. 6 illustrates a CRT image 80 and shows the variation in the magnitude and orientation of the effective beam correction as a function of coordinate location in the image 80. At the center of the image 80, the correction corresponds to that produced with zero voltage settings on both the controls A6 and B6 (i.e., no correction at all). As one moves outwardly away from the center of the image 80, either along the X and the Y axis, the correction corresponds to that produced as the voltages settings on the controls A6 and B6 are moved away from zero volts. At the coordinate location $(V_1,V_2)$ in the image 80, the correction corresponds to that produced by a voltage setting of $V_1$ on the control A6 and by a voltage setting of $V_2$ on the control B6.

With the automatic stigmator switch 70 in the ON position, the operator of the microscope 10 may thus view the image produced by the CRT 46 and simultaneously observe and directly compare the various areas of the image corresponding to the different stigmator settings. The operator need not vary the stigmator controls A6 and B6 and need not remember what the image looked like prior to the time that a setting was changed to determine whether the image improved or degraded as a result of the change. The operator need only select the X and Y coordinates corresponding to the sharpest area in the image to determine the manual stigmator control settings that provide the optimum astigmatism correction. As will be more fully appreciated from the discussion below with reference to the image photographs of FIG. 7, the sharpest area in the image 80, or the "center of sharpness" as it was referred to hereinabove, is usually quite well defined in the image, particularly at higher magnifications, and thus readily discernible by the operator.

The circuitry of FIG. 4 includes components which facilitate the selection by the operator of the center of sharpness in the mapped image. These components include a pair of voltage comparators C1 and C2 and an index marker switch 76 including movable switch contacts C11, C12, C21 and C22. The output of the comparator C1 is connected to the X driving input of the CRT 46, while the output of the comparator C2 is connected to the Y driving input of CRT 46.

When the index marker switch 76 is in the OFF position, the comparators C1 and C2 have no inputs and therefore zero outputs. There is thus no effect on the image produced by the CRT 46. When the switch 76 is moved to the ON position, however, the XSCAN signal is coupled to one input of comparator C1 and the output of the manual stigmator control A6 is coupled to the other input of comparator C1. Similarly, with the switch 76 in the ON position, the YSCAN signal is coupled to one input of comparator C2 and the output of the other manual stigmator control B6 is coupled to the other input of comparator C2. The comparator C1 thus produces an output pulse synchronized with the CRT display which appears in the CRT image as a horizontal, or X axis parallel, index line at an X coordinate location corresponding exactly to the setting on the manual stigmator control A6. Similarly, the comparator C2 produces an output pulse which appears in the image as a vertical, or Y axis parallel, index line at a Y coordinate location corresponding exactly to the setting on the stigmator control B6. The index line markers are illustrated as lines 82 and 84 in FIG. 6 centered on the image 80 and therefore corresponding to zero voltage settings on both the controls A6 and B6. The markers 82 and 84 are independently movable across the image 80 by varying the settings on the controls A6 and B6.

To select the center of sharpness in the CRT image, the operator switches the switch 76 to the ON position and moves the index markers 82 and 84 by manipulating the controls A6 and B6 until the markers 82 and 84 intersect over the center of sharpness in the image. When the automatic stigmator switch 70 and index marker switch 76 are switched OFF, the settings that achieve the desired astigmatism correction remain on the controls A6 and B6.

The photographs (i.e., micrographs) of FIG. 7 are of a typical microscope image at various stages in the practice of the astigmatism compensating method described above. FIG. 7A shows a typical uncompensated microscope image that results when the scanning beam 12 in the microscope 10 is astigmatic. As can be appreciated from FIG. 7A, the image is "smeared", making it quite difficult to discern detail therein. Test results indicate that the smearing in the image is always in a direction corresponding to the longer axis of the astigmatic scanning beam 12.

Figure 7A:
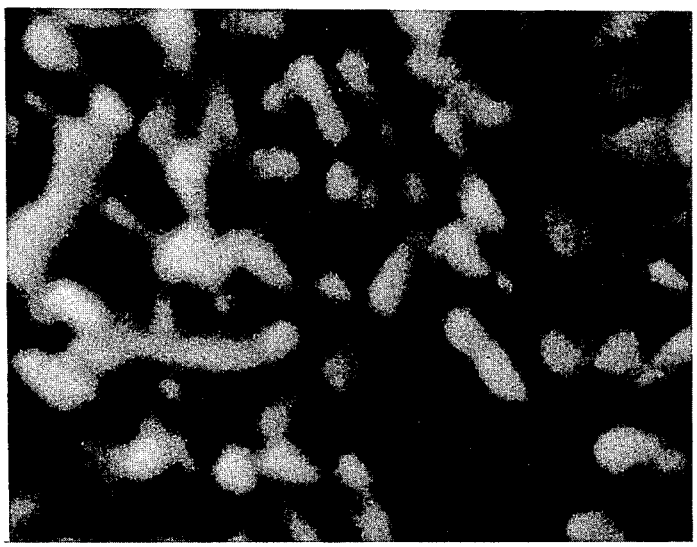
FIGS. 7A through 7D, shows photographs of typical microscope images (micrographs), with FIG. 7A showing an image prior to astigmatism correction, FIG. 7B showing the image with the astigmatism mapping and X and Y index markers switched on, FIG. 7C showing the image with the X and Y index markers positioned over the center of sharpness in the image, and FIG. 7D showing the image after the astigmatism mapping and index markers are switched off and as corrected.
Figure 7B:
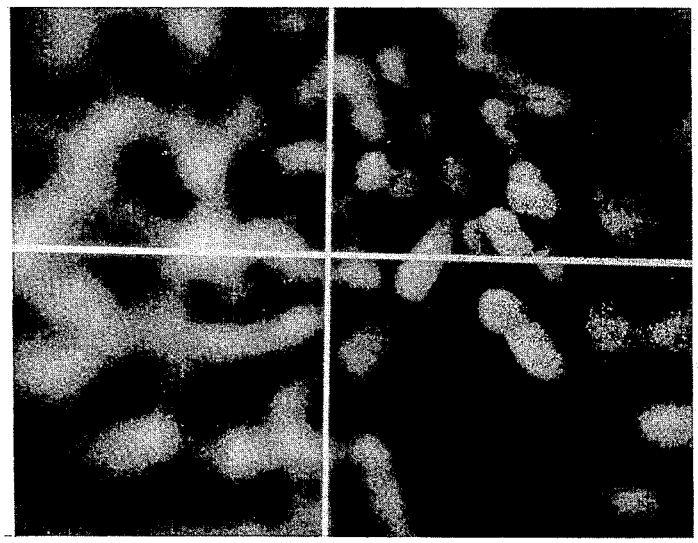

FIG. 7B illustrates the same image as that shown in FIG. 7A, but with the automatic stigmator switch 70 and the index marker switch 76 both in the ON position. The index markers 82 and 84 are centered on the image (i.e., the controls A6 and B6 are both zeroed). The image of FIG. 7B is thus an X-Y map of all possible settings of the controls A6 and B6. The center of sharpness in the mapped image is readily discernible and appears in the upper right hand quadrant of the image. As can be appreciated from FIG. 7B, the mapped image has a vortex-like appearance in which the image detail appears to "swirl" about the center of sharpness which appears stationary.

Figure 7C:
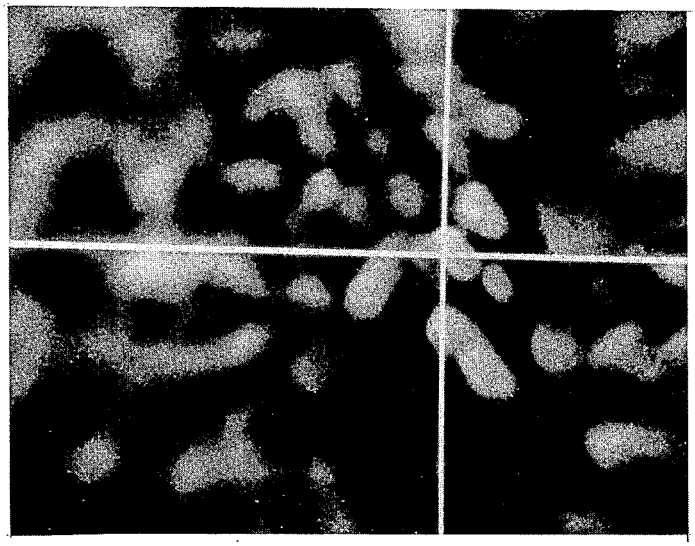

FIG. 7C shows the same image as FIG. 7B, but with the index markers 82 and 84 centered over the center of sharpness therein. The markers 82 and 84 locate the center of sharpness in the image similar to the way the cross-hairs in a gun sight locate a target.

Figure 7D:
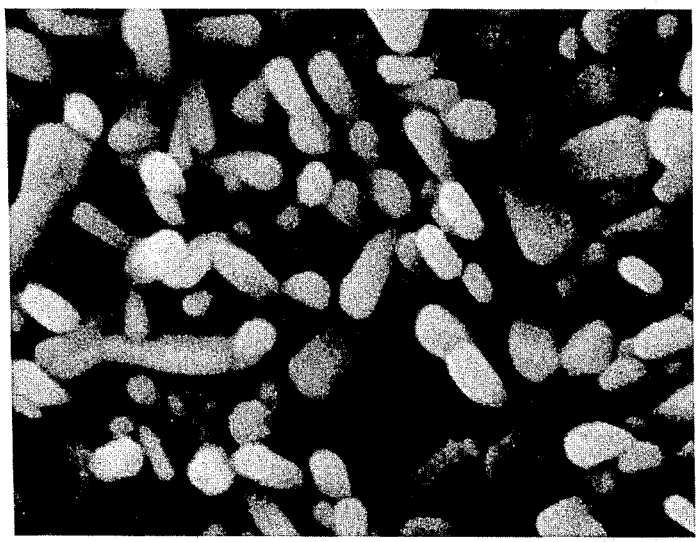

FIG. 7D shows the image after the automatic stigmator switch 70 and index marker switch 76 are switched OFF and with the appropriate astigmatism compensating settings remaining on the controls A6 and B6. As can be appreciated, the corrected, or stigmatized image of FIG. 7D is substantially sharper and clearer than the uncorrected image of FIG. 7A.

Thus, astigmatism correction may be achieved in a relatively simple and straightforward manner utilizing the above-described circuitry and method. Most, if not all, of the trial and error inherent in conventional astigmatism correction is eliminated from the described method. It becomes a relatively simple task, even for unskilled operators, to achieve properly corrected images even in instruments in which the astigmatism is quite severe.

As indicated hereinabove, the mapped image that is produced according to the above-described method and circuitry has utility other than simply as a tool in achieving astigmatism correction. The mapped image can, for example, be used to determine the quality of the focus of the electron beam 12 with respect to the object 36 being viewed. To understand how such a focus determination may be made, reference is made to the photographs shown in FIG. 8 of the drawing.

Figure 8A:
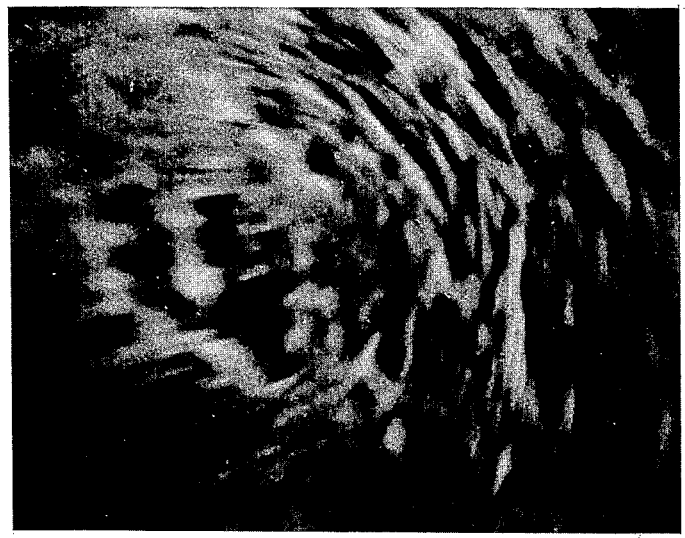
FIGS. 8A through 8C, shows photographs of typical microscope images (micrographs), with FIG. 8A showing an image with the astigmatism mapping switched on and wherein the electron beam is over-focused, FIG. 8B showing the image with the astigmatism mapping switched on and wherein the electron beam is under-focused, and FIG. 8C showing the image with the astigmatism mapping switched on and wherein the electron beam is correctly focused.
Figure 8B:
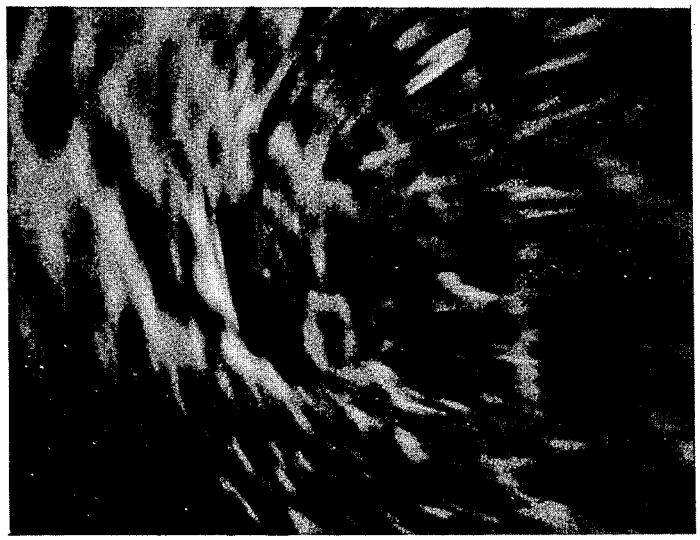
Figure 8C:
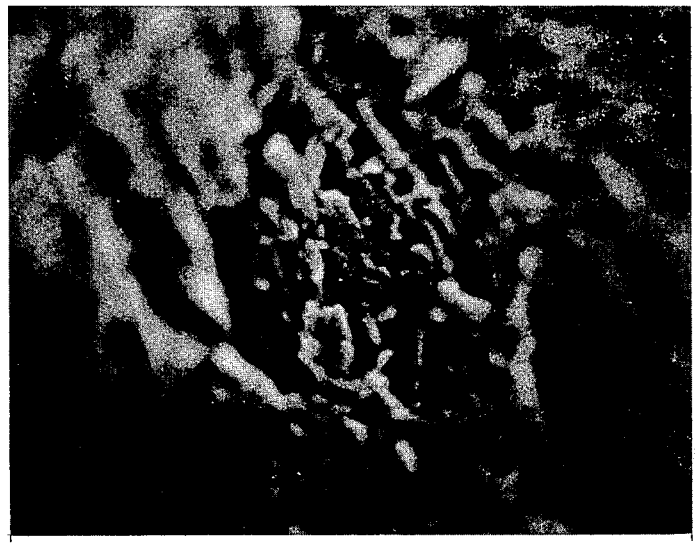

Each of the photographs in FIGS. 8A, 8B and 8C shows a typical microscope image of the type that is produced when the automatic stigmator switch 70 of FIG. 4 is in the ON position. However, in FIG. 8A, the scanning electron beam 12 is slightly over-focussed relative to the object 36; that is, the beam 12 achieves a minimum cross-section at some point above the object 36 rather than directly on the object 36 as would be the case if the beam 12 were correctly focussed. In FIG. 8B, the beam 12 is slightly under-focussed relative to the object 36; that is, it achieves its minimum cross-section at some point below the object 36. In FIG. 8C, the beam 12 is correctly focussed.

From FIGS. 8A and 8B, it can be seen that the images that are slightly over or under-focussed exhibit a characteristic, readily discernible curved or comet-like distortion when viewed as mapped images. In the over-focussed image of FIG. 8A, the distortion appears to emanate from the left side of the image (e.g., the "comet" appears to be traveling from left to right in the image). In the under-focussed image of FIG. 8B, the distortion appears to emanate from the right side of the image (e.g., the "comet" appears to be traveling from right to left in the image). In the correctly focussed image of FIG. 8C, the directionality of the distortion disappears and the image again assumes its vortex-like appearance.

As a result, the operator of the microscope 10, after roughly focussing the electron beam 12, can switch the automatic stigmator switch 70 to the ON position and determine whether additional fine focussing is necessary. From the appearance of the image, the operator can determine the sense of the fine focussing correction necessary to achieve optimum focussing. The operator can adjust the fine focussing control while viewing the mapped image until the image appears as that illustrated in FIG. 8C.

Also as noted above, the mapped image produced by the described method and circuitry may be used as an indicator of the condition of the microscope 10 and as a guideline for determining when routine maintenance of the microscope 10 is due. With in the index markers 82 and 84 positioned over the center of sharpness of a mapped image, as indicated in FIG. 7C, the radial distance from the center of the image to the intersection of the index markers is a direct indication of the severity of astigmatism in the microscope 10. That radial distance may be used as an indicator of the quality or condition of the microscope 10. Additionally, a guideline may be established for the microscope 10 such that, when the radial distance exceeds a certain, predetermined value, the microscope 10 is removed from service for routine maintenance.

It should be understood that the above-described method and circuitry are intended to illustrate rather than limit the invention and that various modifications and additions may be made thereto by those skilled in the art without departing from the scope of the invention as defined by the appended claims. For example, the mapped image that is produced with the described method and circuitry may have uses other than those specifically discussed above. Also, while the above discussion has directed to the correction of electron beam astigmatism with magnetic fields generated by drive currents applied to an electromagnetic stigmator coil system, the same techniques can be applied to electrostatic stigmator systems which achieve beam shaping with electric fields generated by voltages applied to plates around the beam axis. Furthermore, the invention is not intended to be limited in its application to scanning electron microscopes, but may have equal application to other instruments which utilize charge carrier beams and in which control of the cross-section or other characteristic of the beams is important. It is thus the object of the appended claims to cover these and other modifications as come within the true scope of the invention.

What I claim as new and desire to secure by Letters Patent of the United States is:

1. A method of compensating for charge carrier beam astigmatism in equipment of the type that utilizes such a beam in the generation of an image and that includes astigmatism correcting means including first and second manually and independently adjustable drive means for providing the astigmatism correcting means with first and second drive signals, respectively, to enable a shaping of the beam so as to reduce the astigmatism, each of said first and second drive signals having a range of values, said method comprising the steps of:

A. generating with the beam a mapped X-Y image characterized in that each point with coordinates ($V_1, V_2$) within said mapped image shows the effect of said first drive means providing the astigmatism correcting means with a drive signal of value $V_1$ and said second drive means providing the astigmatism correcting means with a drive signal of value $V_2$;

B. selecting the coordinate location of said mapped image corresponding to the best-corrected area of said mapped image; and C. applying the drive signal values corresponding to said selected coordinate location to the astigmatism correcting means.

2. The method of claim 1 in which the equipment is of the type that further includes means for scanning the beam across an object in a raster pattern to generate an image of the object and means for supplying X and Y raster scan signals to the scanning means to control the scanning of the beam and in which said generating step includes the steps of
   i. temporarily disconnecting said first and second drive means from the astigmatism correcting means, and
   ii. applying the X and Y raster scan signals to the astigmatism correcting means.

3. The method of claim 2 in which the drive signal values provided by each of said drive means include values ranging from a predetermined positive value to a predetermined negative value and in which said generating step further includes the step of
   i. adjusting the X and Y raster scan signals applied to the astigmatism means so that the peak values thereof match said predetermined positive and negative values.

4. The method of claim 2 in which the equipment is of the type further including means switchably connectible to said first and second drive means for generating X and Y index markers in the image, the X and Y index markers appearing at coordinate locations in the image corresponding to the drive signal values provided by said first and second drive means, respectively,
   in which said selecting step includes the step of:
   i. adjusting the first and second drive means so as to move the X and Y index markers in said mapped image so that the markers intersect over the best-corrected area of said mapped image, and
   in which said applying step includes the step of
   i. disconnecting the X and Y index marker generating means from, and reconnecting the astigmatism correcting means to, the first and second drive means, whereby the drive signal values corresponding to said selected coordinate location are automatically applied to the astigmatism correcting means.

5. A method of compensating for electron beam astigmatism in scanning electron microscope equipment of the type that utilizes a scanning electron beam in the generation of an image of an object to be viewed at high magnification and that includes a stigmator system including first and second manually and independently adjustable stigmator controls for providing the stigmator system with first and second drive signals, respectively, to enable a shaping of the electron beam so as to reduce the astigmatism, each of said first and second drive signals having a range of values, said method comprising the steps of:

A. generating with the electron beam a mapped X-Y image characterized in that each point with coordinates ($V_1, V_2$) within said mapped image shows the effect of said first stigmator control providing the stigmator system with a drive signal of value $V_1$ and said second stigmator control providing the stigmator system with a drive signal of value $V_2$;

B. selecting the coordinate location of said mapped image corresponding to the best-corrected area of said mapped image; and C. applying the drive signal values corresponding to said selected coordinate location to the stigmator system.

6. In charge carrier beam equipment of the type that utilizes a charge carrier beam in the generation of an image and that includes astigmatism correcting means including first and second manually and independently adjustable drive means for providing the astigmatism correcting means with first and second drive signals, respectively, to enable a shaping of the beam so as to reduce the astigmatism, each of said first and second drive signals having a range of values, apparatus useable with the manually adjustment astigmatism correcting means for facilitating astigmatism correction in the equipment, said apparatus comprising:

A. means for generating with the beam a mapped X-Y image characterized in that each point with coordinates ($V_1, V_2$) within said mapped image shows the effect of said first drive means providing the astigmatism correcting means with a drive signal of value $V_1$ and said second drive means providing the astigmatism correcting means with a drive signal of value $V_2$; and B. means for applying the drive signal values corresponding to coordinate location of the best-corrected area of said mapped image to the astigmatism correcting means.

7. The apparatus of claim 6 in which the equipment is of the type further including means for scanning the beam across an object in a raster pattern to generate an image of the object and means for supplying X and Y raster scan signals to the scanning means to control the scanning of the beam and in which said generating means includes
   i. switch means which in a first position connect said first and second drive means to the astigmatism correcting means and which in a second position disconnect said first and second drive means from the astigmatism correcting means and connect the astigmatism correcting means to receive the X and Y raster scan signals from the supplying means, whereby said mapped image is generated when said switch means is in its second position.

8. The apparatus of claim 7 in which the drive signal values provided by each of said drive means include values ranging from a predetermined positive value to a predetermined negative value and in which said generating means further includes
   i. means for adjusting the X and Y raster scan signals applied to the astigmatism correcting means so that the peak values thereof match said predetermined positive and negative values.

9. The apparatus of claim 7 in which said applying means includes
   i. means for generating X and Y index markers in said mapped image at coordinate locations corresponding to the drive signal values provided by said first and second drive means, respectively, and ii. index marker switch means which in a first position connects said first and second drive means to said index marker generating means and which in a second position disconnects said first and second drive means from said index marker generating means, whereby when said index marker switch means is in its first position said X and Y index markers may be moved in said mapped image by adjusting said first and second drive means to select the coordinate location corresponding to the best-corrected area of said mapped image and whereby when said first and second drive means are thereafter reconnected to the astigmatism adjustment means the drive signal values corresponding to said selected coordinate location are automatically applied to the astigmatism adjustment means.

10. The apparatus of claim 9 in which each of said drive means comprises an adjustable voltage control coupled to a voltage controlled current source for providing variable current drive signals to said coils, in which the X and Y raster scan signals comprise voltage ramp signals, and in which said X and Y index marker generating means comprise first and second voltage comparators, said first voltage comparator receiving as inputs the X raster scan signal from said supplying means and to voltage output of said adjustable voltage control of said first drive means when said index marker switch is in its first position, said second voltage comparator receiving as inputs the Y raster scan signal from said supplying means and the voltage output of said adjustable voltage control of said second drive means when said index marker switch is in its first position.

11. The apparatus of claim 6 in which the astigmatism correcting means comprises a plurality of electromagnetic coils disposed about the beam and in which each of said drive means comprises an adjustable voltage control coupled to a voltage controlled current source for providing variable current drive signals to said coils.

12. The apparatus of claim 6 in which the equipment comprises a scanning electron microscope that utilizes a scanning electron beam in the generation of an image of an object to be viewed at high magnification.

* * * * *